United States Patent
Meyer

(10) Patent No.: US 10,199,307 B2
(45) Date of Patent: Feb. 5, 2019

(54) COOLING DEVICE FOR A CURRENT CONVERTER MODULE

(71) Applicant: VENSYS Elektrotechnik GmbH, Diepholz (DE)

(72) Inventor: Christoph Meyer, Diepholz (DE)

(73) Assignee: VENSYS ELEKTROTECHNIK GMBH, Diepholz (DE)

( * ) Notice: Subject to any disclaimer, the term of this patent is extended or adjusted under 35 U.S.C. 154(b) by 0 days.

(21) Appl. No.: 14/974,866

(22) Filed: Dec. 18, 2015

(65) Prior Publication Data

US 2016/0181178 A1 Jun. 23, 2016

Related U.S. Application Data

(63) Continuation of application No. PCT/EP2014/001660, filed on Jun. 18, 2014.

(30) Foreign Application Priority Data

Jun. 18, 2013 (DE) .................. 10 2013 010 088

(51) Int. Cl.
*H01L 23/473* (2006.01)
*H01L 23/34* (2006.01)
(Continued)

(52) U.S. Cl.
CPC .......... *H01L 23/473* (2013.01); *F28D 1/0246* (2013.01); *F28D 15/00* (2013.01);
(Continued)

(58) Field of Classification Search
CPC ....... F28D 1/0246; F28D 15/00; H01L 23/34; H01L 23/345; H01L 23/367; H01L 23/373; H01L 29/7393; H01L 2924/0002
See application file for complete search history.

(56) References Cited

U.S. PATENT DOCUMENTS 4,047,561 A 9/1977 Jaster et al.
4,051,509 A * 9/1977 Beriger .............. H01L 23/473
165/80.4
(Continued)

FOREIGN PATENT DOCUMENTS

EP 0 993 243 4/2000
EP 1 577 739 9/2005
(Continued)

OTHER PUBLICATIONS

International Preliminary Report on Patentability, PCT/EP2014/001660, dated Dec. 23, 2015.

*Primary Examiner* — Hung S Bui
*Assistant Examiner* — Michael Matey
(74) *Attorney, Agent, or Firm* — Shlesinger Arkwright & Garvey LLP

(57) ABSTRACT

In order to prevent the formation of condensation in a cooling device for a current converter module, the cooling device has a cooling liquid channel, which conducts a liquid coolant and which is connected to a cooling circuit, a heat exchanger, which is connected in the cooling circuit and to which a power component is coupled in a thermally conductive manner, and a cooler for cooling the liquid coolant, which cooler is connected in the cooling circuit, wherein there is a heater in the cooling circuit such that the heat exchanger can be heated upon demand by heating the coolant.

6 Claims, 2 Drawing Sheets

(51) Int. Cl.
*F28D 1/02* (2006.01)
*H01L 29/739* (2006.01)
*H05K 7/20* (2006.01)
*F28D 15/00* (2006.01)
*H01L 23/367* (2006.01)
*H01L 23/373* (2006.01)

(52) U.S. Cl.
CPC ............ *H01L 23/34* (2013.01); *H01L 23/345* (2013.01); *H01L 23/367* (2013.01); *H01L 23/373* (2013.01); *H01L 29/7393* (2013.01); *H01L 2924/0002* (2013.01)

(56) References Cited

U.S. PATENT DOCUMENTS

| | | | | |
|---|---|---|---|---|
| 7,907,406 B1* | 3/2011 | Campbell | ............... | H05K 7/202 165/104.33 |
| 8,151,868 B2* | 4/2012 | Inagaki | ................ | F28D 1/0333 165/153 |
| 8,363,403 B2* | 1/2013 | Tonomoto | ........... | H01L 23/4334 165/80.2 |
| 2005/0121173 A1* | 6/2005 | Inagaki | ................ | F28D 1/0325 165/80.3 |
| 2006/0002086 A1* | 1/2006 | Teneketges | ........... | H01L 23/473 361/699 |
| 2008/0223555 A1 | 9/2008 | Di Stefano | | |
| 2008/0307806 A1* | 12/2008 | Campbell | ............... | F24F 5/0017 62/121 |
| 2009/0014156 A1 | 1/2009 | Vetrovec | | |
| 2009/0236081 A1 | 9/2009 | Oconte | | |
| 2010/0253079 A1 | 10/2010 | Bolln | | |
| 2011/0284197 A1* | 11/2011 | Sugimoto | ............ | F28D 1/0333 165/185 |
| 2012/0120603 A1* | 5/2012 | Campbell | .......... | H05K 7/20781 361/698 |
| 2012/0227954 A1* | 9/2012 | Uchida | ................ | F28D 15/043 165/253 |
| 2013/0319635 A1* | 12/2013 | Kobayashi | ............ | H01L 23/473 165/104.11 |
| 2014/0069111 A1* | 3/2014 | Campbell | .............. | B21D 53/02 62/3.2 |
| 2014/0096930 A1* | 4/2014 | Krug, Jr. | ............ | H05K 7/20781 165/11.1 |
| 2014/0124163 A1* | 5/2014 | Campbell | ............... | F24T 10/30 165/45 |
| 2014/0202678 A1* | 7/2014 | Goth | ................. | H05K 7/20772 165/287 |
| 2015/0131228 A1* | 5/2015 | Ishikawa | ............. | G01M 3/047 361/699 |
| 2016/0136749 A1* | 5/2016 | Lee | ........................ | B23K 9/091 219/130.1 |

FOREIGN PATENT DOCUMENTS

| | | |
|---|---|---|
| EP | 2 264 559 | 12/2010 |
| EP | 2 361 006 | 8/2011 |

\* cited by examiner

COOLING DEVICE FOR A CURRENT CONVERTER MODULE

RELATED APPLICATIONS

This is a continuation application of International PCT Application No. PCT/EP2014/001660, filed on Jun. 18, 2014, claiming the priority benefit of Germany Patent Application No. 10 2013 010 088.7, filed on Jun. 18, 2013, both of which are hereby incorporated by reference.

FIELD OF THE INVENTION

The invention relates to a cooling device for a current converter module.

BACKGROUND OF THE INVENTION

In the case of systems to generate electrical energy, for instance wind power systems or solar power systems, current converter modules are used, which convert the generated direct voltage or alternating voltage to a voltage that has the frequency required by the grid connection point. Depending upon the application case, these types of converters can have a power transfer of several kW to several MW. Located inside the current converter module are fast-switching power semiconductors, for example bipolar transistors with insulated-gate bipolar transistor (IGBT for short). The heat that develops based on conversion losses is dissipated at one or more heat sinks. This heat must be dissipated by a corresponding cooling device so that the power semiconductor is not destroyed due to overheating.

The heat dissipated at the heat sinks is preferably conveyed directly to a heat exchanger, through which a cooling liquid flows. For example, a water/ethanol mixture or a water/glycol mixture is used as a cooling liquid to protect against corrosion or frost.

The cooling liquid is supplied in a cooling circuit, in turn, to an air cooler and correspondingly cooled there, before being led back, in turn, via a pump to the heat exchanger of the power semiconductor.

A problem with such a cooling circuit can be a condition where the temperature on the heat exchanger of a power semiconductor drops as an exception below the temperature of the ambient air. This case can occur, for example, when the current converter module is switched off during the execution of maintenance work. The result of this is a formation of condensation on the heat exchanger, which can cause damage to or even destroy electronic components.

Therefore, the problem addressed by the invention is preventing the formation of condensation in a cooling device for a current converter module.

This problem is solved by the features of present invention.

Additional embodiments of the present invention are disclosed.

BRIEF DESCRIPTION OF THE DRAWINGS

Further details and advantages of the invention are explained based on the following figures, which show.

DETAILED DESCRIPTION OF THE INVENTION

Figure 1:
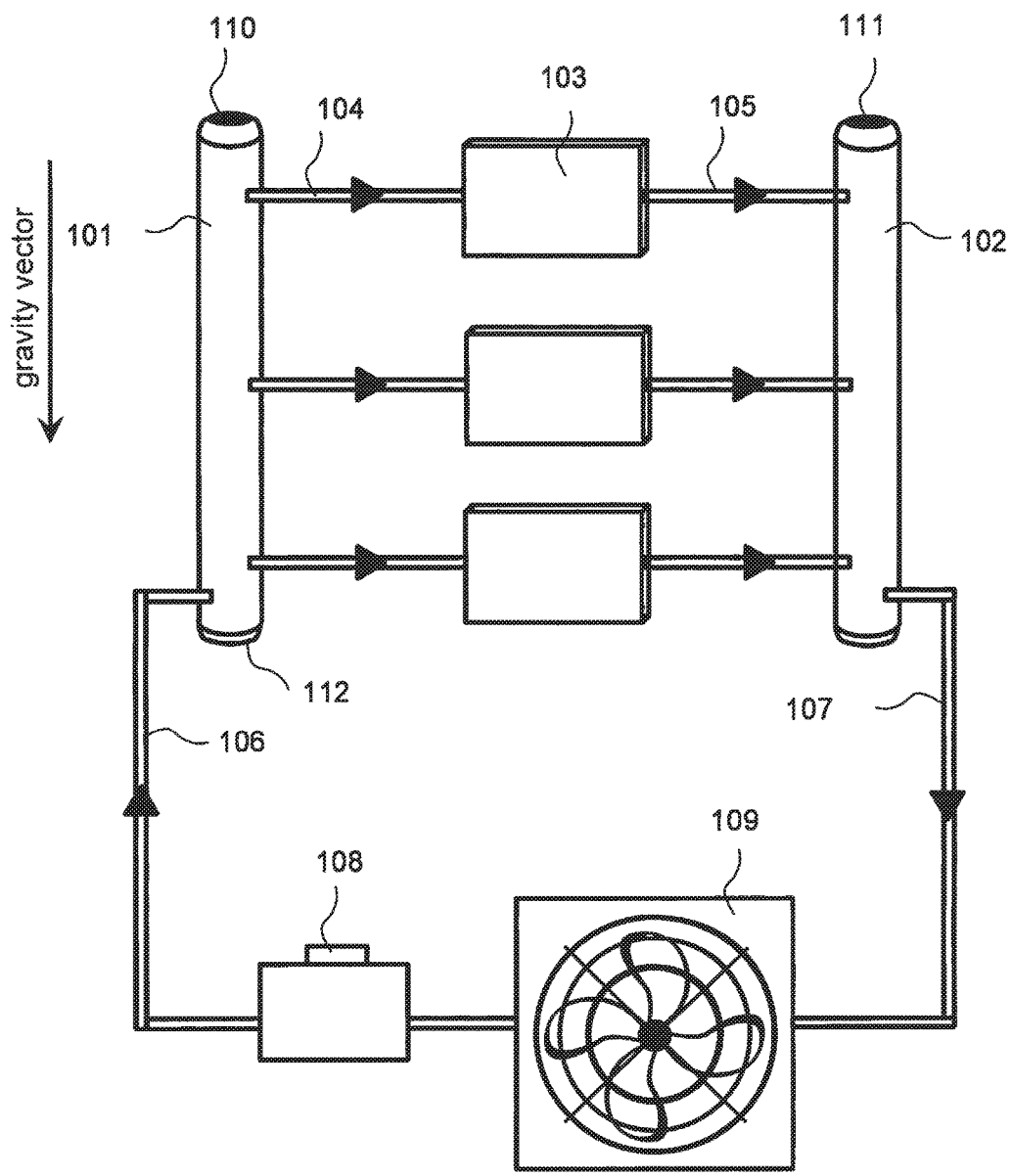
FIG. 1 A simplified diagram of the cooling device according to the invention, and FIG. 2 A simplified diagram of the heat exchanger used according to FIG. 1.

FIG. 1 shows a simplified diagram of the cooling device according to the invention.

The cooling device according to the invention consists overall of a cooling circuit operated with a liquid coolant. A water/ethanol mixture is used as the coolant. In addition, a corrosion inhibitor is added to the coolant. The inhibitor keeps the lime in the water suspended in the solution and protects the steel, aluminum and cooper materials of the cooling device through the formation of a protective film (oxygen diffusion).

As an example, it is assumed that the cooling device is provided for a current converter module of a wind power system or a solar power system for network supply. These types of current converter modules must be designed for powers of several kW up to several MW and have a plurality of power components. In particular, in the top power class of several MW, it is advantageous if a power component is respectively coupled with a heat exchanger and a cooling liquid channel.

As an example, it is further assumed that 3 IGBTs are supposed to be cooled in the cooling circuit. Of course, the invention is also applicable to the cooling of only one IGBT or to any desired plurality of IGBTs.

For reasons of simplicity, only one IGBT of the 3 IGBTs together with the associated heat exchanger is identified with reference sign 103. The heat exchanger 103 of said IGBT is connected via the cooling liquid channel 104 in the feed line (i.e., viewed in the flow direction of the liquid coolant behind the cooler and in front of the heat exchanger) to a perpendicularly mounted (i.e., parallel to the gravity vector) distributor pipe 101. The flow cross-section of the distributor pipe 101 is greater than the flow cross-section of the inlet and outlet cooling liquid channels.

In a corresponding manner, the heat exchanger 103 of said IGBT is connected via the cooling liquid channel 105 in the return line (i.e., viewed in the flow direction of the liquid coolant behind the heat exchanger and in front of the cooler) to a likewise perpendicularly mounted (i.e., parallel to the gravity vector) distributor pipe 102. The flow cross-section of the distributor pipe 102 is in turn greater than the flow cross-sections of the inlet and outlet cooling liquid channels.

Figure 2:
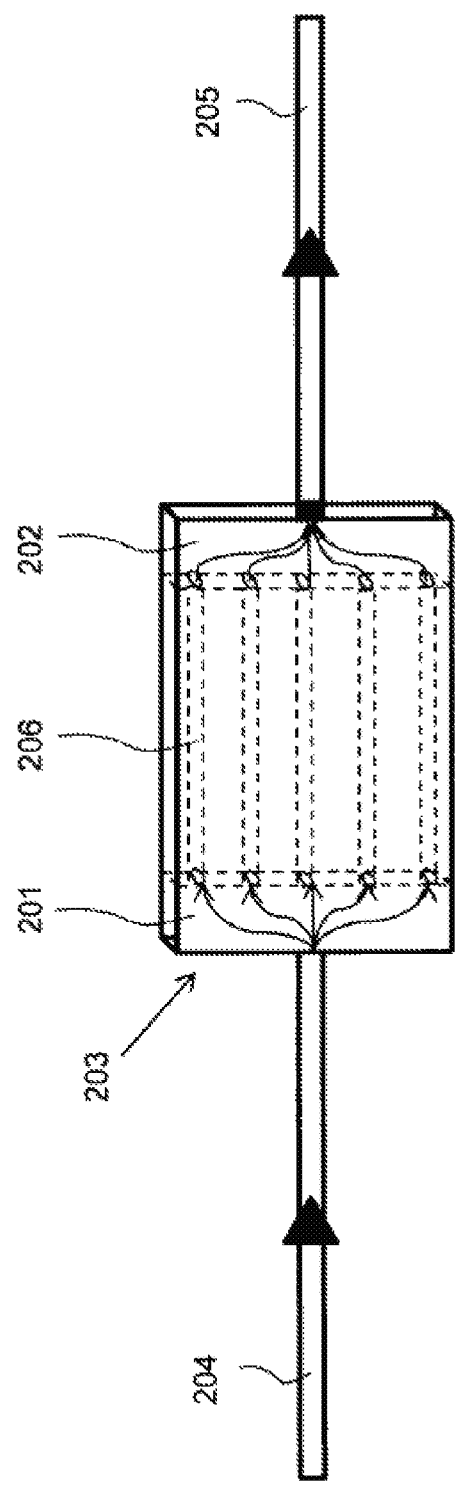

The function of the heat exchanger is explained in further detail below based on FIG. 2. At this point, the mounting direction of the heat exchanger will also be discussed with reference to the gravity vector. The depictions in FIG. 1 and FIG. 2 show a mounting direction parallel to the gravity vector (i.e., the gravity vector lies in the drawing plane). This mounting direction is often necessary for space reasons (and was selected in this case for presentation purposes), but is in no way mandatory for the function of the overall cooling device. A disadvantage of this mounting direction is the fact that air bubbles can possibly accumulate in the upper portion of each heat exchanger 103. Another possibility of each heat exchanger 103 is therefore the mounting direction perpendicular to the gravity vector, i.e., the gravity vector is then perpendicular on the plane of each heat exchanger 103. In this case, air bubbles distribute themselves uniformly in the heat exchanger and can be released again immediately via the cooling liquid.

The coolant for the return line is collected in the distributor pipe 102 and is guided via the cooling liquid channel 107 to an air cooler 109. The air cooler 109 cools down the temperature of the coolant to a required extent and conveys the coolant again to the cooling circuit in the feed line.

Viewed in the flow direction of the coolant, the pump 108 is situated behind the air cooler 109, and said pump supports and maintains the circulation of the coolant within the cooling circuit. If one would like to utilize the natural convection of the cooling liquid for the circulation of the coolant (i.e., warm cooling liquid rises upwards with respect to the gravity vector and cold cooling liquid sinks downward with the gravity vector), it is then necessary for the air cooler 109 to be installed with respect to the gravity vector at the highest point of the cooling circuit. The connection of the air cooler in FIG. 1 must then be modified accordingly.

The coolant finally reaches the feed line again via the cooling liquid channel 106 and therefore the distributor pipe 101, which conveys the cooling liquid to the IGBT 103.

Located above the distributor pipe 101 or 102 is a ventilation valve 110 or 111. The ventilation valve 110 or 111 is controlled mechanically by a membrane, which contracts when dying and expands again when in contact with water.

The ventilation valve 110 or 111 can be installed respectively in both distributor pipes 101 and 102. The functioning of the ventilation valve is still ensured, however, if it is installed either in the distributor pipe 101 or in the distributor pipe 102. The following description relates only to the ventilation valve 110.

If air now gets into the cooling circuit, then the air is transported through the cooling circuit in the form of air bubbles until reaching the distributor pipe 101. The flow cross-section of the distributor pipe 101 is thereby greater than flow cross-section of the cooling liquid channel 104. This causes the flow speed of the coolant in the distributor pipe 101 to be less than the flow speed of the coolant in the cooling liquid channel 104 so that the air bubbles have enough time to rise in the distributor pipe 101 to the ventilation valve 110.

The same also applies to the ventilation valve 111 in the distributor pipe 102 with the flanged-mounted cooling liquid channel 105.

The distributor pipe 102 can be mounted with respect to the gravity vector at the same height as the distributor pipe 101, as shown in FIG. 1. This mounting method is not mandatory however. Another preferred mounting method consists for example of mounting the distributor pipe 102 higher with respect to the gravity vector than the highly mounted heat exchanger. In this way, it is possible for air bubbles that have collected in the heat exchangers or that form there to be transported effectively into the distributor pipe 102 and be vented there via the ventilation valve 111.

There are several possibilities for the design of the ventilation valve. For example, the air release valve can be controlled by a membrane, which contracts in a dry state and therefore opens the air release valve and expands when in contact with water and closes the air release valve. Another possibility consists of connecting the air release valve to a control unit and is opened by the control unit to release air as soon as an air inclusion sensor within the distributor pipe in the vicinity of the air release valve detects an air quantity that exceeds a predetermined amount. The air inclusion sensor can be based for example on the signal of a float gauge, the level of which is evaluated.

Located beneath the distributor pipe 101 or 102 is a heater 112. The heater 112 can consist, for example, of a heating coil leading into the distributor pipe 110, to which current is correspondingly applied as needed.

The purpose of the heater 112 is so that the heat exchanger can be heated as needed via a heating of the coolant, and specifically in case, as an exception, one or more heat exchangers assumes a lower temperature than the ambient air. In addition, appropriate temperature sensors are provided to detect this exceptional case.

Said exceptional case normally occurs if the current converter module is not in operation (for example due to maintenance work) and at the same time the ambient air heats up because of external solar radiation (for example during the morning hours). In this case, condensation water forms on the heat exchanger 103 as well as on the heat sinks of the IGBTs and on the IGBT itself, which can cause corrosion or even the destruction of electrical components.

Therefore, if said exceptional case is detected by a control unit, then the control unit switches the heater 112 on. This now causes the heat exchanger 103 not to cool, but rather to heat slightly so that the formation of condensation can be prevented. To maintain the circulating coolant (or now the warming agent), the pump 108 is not necessary in particular when the heater is located with respect to the cooling circuit (or now the heating circuit) in a stand pipe.

FIG. 2 depicts a simplified diagram of the heat exchanger used in accordance with FIG. 1.

The components 203, 204 and 205 correspond to the components 103, 104 and 105 from FIG. 1.

The heat sink of an IGBT is flange-mounted on the rear side of the heat exchanger 203.

Provided inside the heat exchanger 203 are two distributors 201 and 202, between which parallel pipelines 206 are connected. Because of their parallel connection, the parallel pipelines 206 expand the effective flow cross-section of the heat exchanger 203 and simultaneously prevent the formation of turbulent flows. It is preferred that just enough pipelines are connected in parallel in the heat exchanger that the pressure loss on the heat exchanger is not more than 10% of the operating pressure of the cooling circuit.

Overall, the parallel connection of the pipelines within the heat exchanger 103 ensures that the heat exchanger 103 does not constitute too great a flow resistance with respect to the entire cooling circuit so that the temperature difference on the heat exchanger 103 between the feed line 104 and the return line 105 can be kept at a low level.

The temperature difference is preferably always below 10 Kelvin, especially preferably below 5 Kelvin. The low temperature difference in turn ensures that the affected IGBT is uniformly cooled, which increases the service life and reduces the probability of failure.

Adherence to a predetermined temperature difference on the heat exchanger is thus especially desirable. Therefore, there is a need for a technical teaching, which allows a cooling device to be created in a simple manner and without laborious tests, with which the predetermined temperature difference can be adhered to from the outset on the heat exchanger.

Such a technical teaching is possible according to the invention at least if a topology and the boundary conditions of the cooling device can be assumed, as depicted and described in FIG. 1. This means the following in detail:

The cooling device is provided for the cooling of very high power losses (greater than 1 kilowatt per heat exchanger).

A heat exchanger is provided for cooling of a power component (e.g., IGBT).

Situated in the feed line and in the return line is a respective distributor pipe, the flow cross-section of which is greater than the flow cross-sections of the inlet and outlet cooling liquid channels.

The cooler is able to cool the cooling medium with the total power loss that accrues.

The pump is able to maintain a predetermined volume flow V̇ in the cooling circuit with bridged heat exchangers i.e., the heat exchangers are detached for this purpose).

The sought-after heat exchanger should heat the cooling liquid with power loss $P_V$. Therefore, the following energy balance applies for a delta volume $\Delta V$ of the cooling liquid within time interval $\Delta t$:

$$P_V \cdot \Delta t = \dot{V} \cdot \Delta t \cdot \rho c \cdot \Delta T$$

where $P_V$ Power loss
$\Delta t$ Time interval
$\dot{V}$ Volume flow of the cooling liquid
$\rho$ Density of the cooling liquid
c Specific thermal capacity of the cooling liquid
$\Delta T$ Temperature difference on the heat exchanger The knowledge of the invention consists of the fact that the temperature difference $\Delta T$ can actually be adhered to with the above-mentioned boundary conditions and with a plate-shaped heat exchanger, if a plurality of pipelines is connected in parallel in a suitable manner in the heat exchanger. Therefore, the sought-after heater exchanger can be created in a very limited number of tests, in that a plurality of pipelines is connected in parallel in the heat exchanger such that the temperature difference on the heat exchanger does not exceed the predetermined amount $\Delta T$ according to the above formula of:

$$\Delta T = \frac{P_V}{\dot{V} \cdot \rho \cdot c}$$

A numerical example is given in the following (for the sake of simplicity for the cooling medium of water at 20° C.):

Cooling medium: Water
Number of IGBTs: 3
Power loss of each IGBT: 1 kW
Volume flow, overall: 0.15 l/s
Volume flow of each heat exchanger: 0.05 l/s
Density of water at 20° C.: 0.998 kg/l
Specific thermal capacity of water at 20° C.: 4182 J/(kg·K)
Temperature difference of each heat exchanger: 4.8 Kelvin

The invention claimed is:

1. A cooling device for an electrical power component, comprising:
   a cooling circuit operated with a liquid coolant in a flow direction;
   a heat exchanger connected in the cooling circuit, the heat exchanger is coupled to the power component in a thermally conductive manner;
   a cooler for cooling the coolant, which cooler, viewed in the flow direction of the coolant, is connected behind the heat exchanger in the cooling circuit;
   an elongated distributor pipe, which, viewed in the flow direction of the liquid coolant, is connected behind the cooler and in front of the heat exchanger by means of respective cooling liquid channels in the cooling circuit, the cross-section of the distributor pipe is greater than the flow cross-section of the respective cooling liquid channels and the distributor pipe is mounted parallel to a gravity vector;
   a pump connected in the cooling circuit for maintaining circulation of the coolant;
   temperature sensors for detecting temperature of the heat exchanger and for detecting temperature of ambient air;
   a heater for heating the coolant, the heater is located in the distributor pipe; and
   a control unit to analyze signals from the temperature sensors and to switch the heater on when the power component is not in operation and the heat exchanger assumes a lower temperature than the ambient air, so that without using the pump the heated coolant is circulated by natural convection in the cooling circuit and heats the heat exchanger.

2. The cooling device according to claim 1, wherein the power component is a bipolar transistor with an insulated-gate bipolar transistor.

3. The cooling device according to claim 1, wherein the coolant is a water/ethanol mixture.

4. The cooling device according to claim 1, wherein the heater consists of a heating coil, which is disposed beneath the distributor pipe.

5. A current converter module for connection to a wind power system or solar power system for network supply, the current converter module including and has a plurality of power components coupled to respective heat exchangers of a cooling device, the cooling device comprising:
   a cooling circuit operated with a liquid coolant in a flow direction;
   the heat exchangers are connected in the cooling circuit and coupled to the respective power components in a thermally conductive manner;
   a cooler for cooling the coolant, which cooler, viewed in the flow direction of the coolant, is connected behind the heat exchangers in the cooling circuit;
   an elongated distributor pipe, which, viewed in the flow direction of the liquid coolant, is connected behind the cooler and in front of the heat exchangers by means of respective cooling liquid channels in the cooling circuit, the cross-section of the distributor pipe is greater than the flow cross-section of the respective cooling liquid channels and the distributor pipe is mounted parallel to a gravity vector;
   a pump connected in the cooling circuit for maintaining circulation of the coolant;
   temperature sensors for detecting temperature of the heat exchanger and for detecting temperature of the ambient air;
   a heater for heating the coolant, the heater is located in the distributor pipe; and
   a control unit to analyze signals from the temperature sensors and to switch the heater on when the power component is not in operation and the heat exchanger assumes a lower temperature than the ambient air, so that without using the pump the heated coolant is circulated by natural convection in the cooling circuit and heats the heat exchanger.

6. The cooling device according to claim 1, and further comprising a ventilation valve disposed above the distributor pipe.

* * * * *